United States Patent [19]
Carver

[11] Patent Number: 4,916,002
[45] Date of Patent: Apr. 10, 1990

[54] MICROCASTING OF MICROMINIATURE TIPS

[75] Inventor: Thomas E. Carver, Mountain View, Calif.

[73] Assignee: The Board of Trustees of the Leland Jr. University, Stanford, Calif.

[21] Appl. No.: 297,059

[22] Filed: Jan. 13, 1989

[51] Int. Cl.$^4$ .................. B32B 3/10; H01L 21/306; B44C 1/22; C03C 15/00

[52] U.S. Cl. .................. 428/139; 156/644; 156/647; 156/651; 156/653; 156/657; 156/659.1; 156/661.1; 156/662; 357/69; 428/614; 428/632; 428/209; 437/182; 437/228; 437/245

[58] Field of Search .......... 156/628, 644, 647, 651, 156/653, 657, 659.1, 661.1, 662; 437/182, 183, 228, 238, 241, 245, 246, 249; 313/309, 351; 357/65, 69; 428/596, 597, 600, 614, 621, 632, 138, 139, 140, 209

[56] References Cited
U.S. PATENT DOCUMENTS

| | | | |
|---|---|---|---|
| 4,307,507 | 12/1981 | Gray et al. | 156/647 X |
| 4,312,117 | 12/1982 | Robillard et al. | 156/901 X |
| 4,585,991 | 4/1986 | Reid et al. | 156/647 X |
| 4,685,996 | 8/1987 | Busta et al. | 156/628 |
| 4,786,545 | 11/1988 | Sakuma et al. | 428/209 |

OTHER PUBLICATIONS

Kiewit, "Microtool Fabrication by Etch Pit Replication", Rev. Sci. Instrum., vol. 44, No. 12, Dec. 1973, pp. 1741-1742, 156-647.

Primary Examiner—William A. Powell
Attorney, Agent, or Firm—Flehr, Hohbach, Test, Albritton & Herbert

[57] ABSTRACT

A microminiature tip and tip assembly is fabricated using microelectronic fabrication techniques. A masking aperture is formed in a dielectric layer which overlies a (100) silicon substrate. For a square aperture, a pyramidal pit is anisotropically etched into the surface of the silicon substrate. Tungsten is selectively deposited in the pit to form a pyramid-shaped microminiature point. Continued deposition of tungsten fills the aperture to form a base portion of the tip which integrally locks the tip to the dielectric layer, which is fabricated to form a support member for the tip.

26 Claims, 4 Drawing Sheets

MICROCASTING OF MICROMINIATURE TIPS

BACKGROUND OF THE INVENTION

1. Field of the Invention

This invention relates to microminiature tips, and more particularly, to microminiature tips formed using semiconductor integrated circuit fabrication techniques.

2. Prior Art

Microminiature tips have application in a number of scientific and engineering technologies Scanning tunneling microscopes STMs and atomic force microscopes AFMs use very sharp tips which either contact or are placed in close proximity to a surface to be scanned. There are a number of other uses for microminiature tips, such as in profilometers. One important use is as a test probe point or microcontact for use in testing very high speed electronic components, for example, for making direct contact to a transmission line or conductor in a gallium-arsenide microcircuit, which has extremely small spacings between contacts points and which tolerates limited impedance mismatch at frequencies up to 150 gigaHertz. A sharp test probe tip is necessary when probing metals like aluminum which have a naturally occurring thin oxide layer that must be broken through to achieve a low resistivity contact. Various types of microsensors and microactuators would use microminiature tips. In medical and neurobiological applications microminiature tips are useful as ultraminiature electrodes or neuron probes. In an array, microminiature tips would be useful in a tactile sensor.

An atomic force microscope (AFM) scans over the surface of a sample in two different modes of operation In one mode, the contacting mode, a sharp tip is mounted on the end of a cantilever and the tip rides on the surface of a sample with an extremely light tracking force, on the order of $10^{-5}$ to $10^{-10}$N. In the contacting mode of operation, profiles of the surface topology are obtained with extremely high resolution. Images showing the position of individual atoms are routinely obtained In the other mode, the tip is held a short distance, on the order of 5 to 500 Angstroms, from the surface of a sample and is deflected by various forces between the sample and the tip, such forces include electrostatic, magnetic, and van der Waals forces.

Several methods of detecting the deflection of the cantilever are available with subangstrom sensitivity, including vacuum tunneling, optical interferometry, optical beam deflection, and capacitive techniques.

The technical requirements for the cantilever-and-tip assembly include a number of different factors. A low force constant for the cantilever is desirable so that reasonable values of deflection are obtained with relatively small deflection forces. Typical values are 0.01–1000N/m. A mechanical resonant frequency for the cantilever which is greater than 10 kHz ia desirable to increase image tracking speed and to reduce sensitivity to ambient vibrations. Low force constants and high resonant frequencies are obtained by minimizing the mass of the cantilever.

When optical beam deflection is used to detect deflection of the cantilever, deflection sensitivity is inversely proportional to the length of the cantilever. Therefore a cantilever length of less than 1 mm is desirable.

For certain types of deflection sensing, a high mechanical Q is desirable and is achieved by using amorphous or single crystal thin films for fabrication of the cantilever.

In many applications, it is desirable that the cantilever flex in only one direction and have high lateral stiffness. This can be obtained by using a geometry such as V-shape which has two arms obliquely extending and meeting at a point at which the tip is mounted.

It is often required that a conductive electrode or reflective spot be located on the side of the cantilever opposite the tip. This is obtained by fabricating the cantilever from metal or depositing a conductor on certain portions of the cantilever.

The optimum shape of a tip for particular applications varies. For example, in STM and AFM applications a point contact is desired, while in electrical applications, a broader line contact, or knife-edge, is desired for reduced contact impedance. In STM or AFM applications, a sharp tip, that is, a protruding tip with a tip radius less than 500 Angstroms and which may terminate in a single atom, is also desired to provide good lateral resolution. A sharp tip has traditionally been very difficult to obtain in a consistent, reproducible manner.

In the prior art, cantilever arms were obtained by individually fabricating them by hand from fine wires One way of obtaining a tip portion was to etch a wire to a point and to bend the point to perpendicularly extend from the wire. Another way to obtain a tip was to glue a tiny diamond fragment in place at the end of a cantilever. Prior art cantilevers fabricated by using photolithographic techniques did not include integrally-attached sharp protruding tips. A rather dull tip was effectively obtained by using a corner of the microfabricated cantilever itself as a tip. Alternatively, a diamond fragment was glued by hand to the end of a microfabricated cantilever. The cantilever assembly of an AFM is relatively fragile and is virtually impossible to clean when it is contaminated by material from the surface being scanned so that frequent replacement is required.

Anisotropic etching of (100) silicon wafers to form pyramidal-shaped or knife-edged pits is discussed in an article by K. E. Petersen entitled "Silicon as a Mechanical Material," *Proceedings of the IEEE*, Vol. 79, No. 5, pps. 423–430, May 1983. This article also refers to an article by D. A. Kiewit entitled "Microtool fabrication by etch pit replication," *Rev. Sci. Instrum.*, vol.44, p. 1741, 1973, which discloses using thermally grown silicon dioxide as a mask for selective etching of pits in a (100) wafer and which discloses filling those pits with electrolessly deposited nickel-phosphorous.

Currently, technologists are attempting to microfabricate STMs and AFMs using the microfabrication techniques which are compatible with standard fabrication processes used in the silicon semiconductor integrated circuit industry. Their goal is to mass-produce very precise, very reliable sensors which have minimal thermal drift, signal loss, and low noise characteristics by taking advantage of the inherent low mass, high resonant frequencies, and low thermal drift characteristics of microfabricated devices. In addition, these microfabricated sensors can be integrally combined with electronic circuitry fabricated with the same processes.

SUMMARY OF THE INVENTION

It is therefore an object of the invention to provide a microminiature tip fabricated using semiconductor integrated circuit fabrication processes.

It is another object of the invention to produce a uniform, sharp, well-formed, tough, durable, and inexpensive microminiature tip.

In accordance with these and other objects of the invention, apparatus and methods for forming a microminiature tip assembly are disclosed. The microminiature tip assembly includes a support arm member, which is, for example, a cantilever arm. The cantilever arm, in subsequent fabrication steps, may have piezoelectric and conductive layers formed thereupon to provide a transducer for STM applications and for certain AFM applications. A microminiature tip is integrally attached to the support arm member by having a base portion of the tip be engaged, or interlocked, in an aperture formed in the support arm member. The groove engages with the aperture in the support arm, which is formed as a thin dielectric layer of silicon nitride or silicon dioxide, or both. In one embodiment of the invention, the tip is tungsten deposited by a CVD deposition process in a pit etched in a silicon substrate. The pit undercuts the margins of the overlying thin dielectric layer of silicon nitride or silicon dioxide forming the support arm for the tip so that, in effect, a groove is formed within the base portion of the tip.

For the tip itself, a body portion of the tip extends from a base and tapers inwardly. The cross section of the body of the tip is polygonal at any point along its length. For a square cross section, the body portion is pyramidal in shape, extends from a square base plane and terminates in a point. For a rectangular cross section, the body portion terminates in a knife-point shape, that is, in a line.

A method of forming a microminiature tip and a tip assembly are disclosed which take advantages of anisotropic etching of silicon whereby certain etchants selectively etch silicon so that the (111) crystal plane is etched much more slowly, i.e. 400 times slower, than the other crystal planes. Starting from the surface of a (100) silicon wafer and with a square etching window formed in a thin layer of dielectric material, a pyramid-shaped pit is formed having a sharply defined point with the four faces formed along the (111) crystal plane. A tip material is then deposited in the pit which serves as a mold to form a pyramidal-shaped tip body. As the deposition continues, a base portion extending from a base plane is formed by deposition of material into the window, or aperture, formed in the thin dielectric layer to lock the tip in place. The dielectric layer subsequently may be further processed to form a cantilever or support arm for the tip. Tungsten deposited by low pressure chemical vapor deposition forms a conductive tip. Finally, the silicon wafer material surrounding the tip is removed, leaving a microminiature tip integrally attached to the layer of dielectric material.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

The devices and methods of fabrication described hereinbelow are intended to incorporate technology available for producing silicon semiconductor integrated circuits and devices, and particularly for fabricating cantilevers using such technology.

Examples of such technology are disclosed in a patent application by Zdeblick et al. entitled "INTEGRATED SCANNING TUNNELING MICROSCOPE" Ser. No. 149,236, filed Jan. 27, 1988, which is incorporated herein by reference.

Figure 1A:
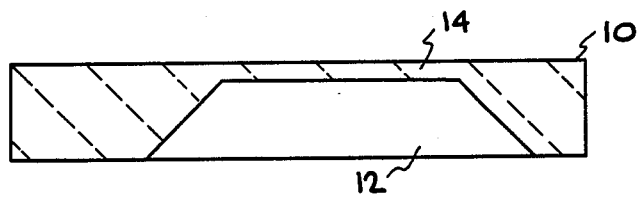
FIGS. 1A and 1B are cross-sectional views of a semiconductor substrate from which a cantilever arm having a first embodiment of a microminiature tip is fabricated.

FIG. 1A shows in cross-section a portion of a (100) silicon wafer 10. Crystalline silicon has the characteristic that etchants such as KOH and EDP (ethylenediamine/pyrocatechol/water) anisotropically etch the silicon material in all planes except the (111) plane. The backside therein of the wafer 10 may optionally have a cavity 12 etched or substrate in which, as described hereinbelow, a microminiature tip will be formed.

Figure 1B:
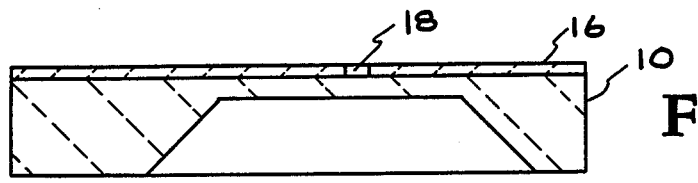

FIG. 1B shows a silicon nitride layer 16 or, alternatively, a silicon dioxide layer formed on the top surface of the wafer 10. An aperture 18 is etched in the nitride layer 16 using conventional photomasking and etching techniques.

Figure 2A:
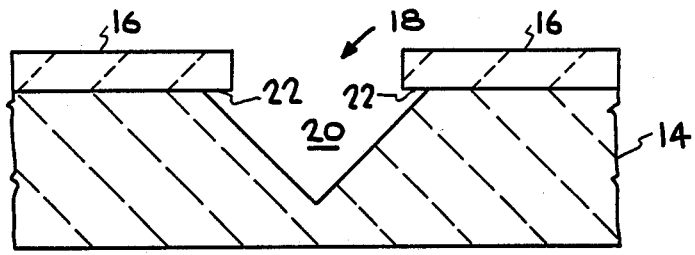
FIGS. 2A through 2D are enlarged cross-sectional views of the region enclosed within the dotted line of FIG. 1A and illustrate a sequence of process steps for forming the first embodiment of a microminiature tip according to the invention.

FIG. 2A shows that the nitride layer 16 serves as a mask for anisotropic etching of a pyramidal pit 20 into the silicon wafer 10 using KOH or EDP. The selective etching characteristic causes the faces of the pyramid to be in the (111) plane of the silicon wafer and the pit 20 to terminate at its bottom in a very sharp point. FIG. 2A shows that undercut regions 22 are formed beneath the nitride layer 16 adjacent to the top perimeter of the pit 20.

Figure 3A:
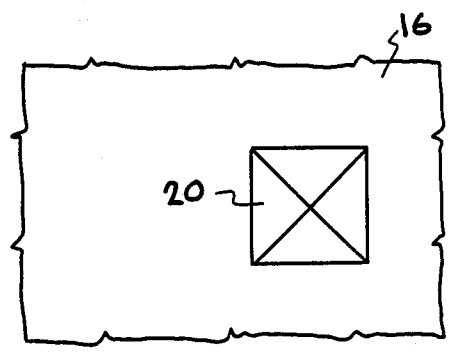
FIG. 3A is a plan view of a pyramidal pit etched into the surface of a silicon substrate, said pit representative of the etched pit depicted in cross-section in FIG. 2A.
Figure 3B:
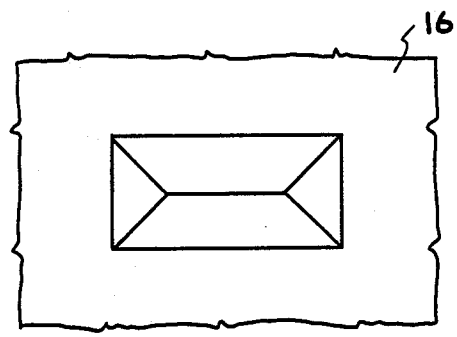
FIG. 3B is a plan view of a knife-edged, rectangular-based pit.

FIG. 3A shows a plan view of this pyramidal pit 20 having equal base lengths. If the masking aperture 18 is not square, the pit will have the shape of pyramid extended in one direction, that is, a knife-edge shape as shown in FIG. 3B. As discussed on page 425 of the Petersen article described hereinabove, to produce a square pyramidal pit, the mask aperture can be any appropriate shape, such as, for example, a circle or a square, which has equal, orthogonal dimensions appropriately oriented to the crystal planes of the silicon wafer. If the dimensions are not equal, a rectangular pit is produced which terminates in a line at its apex.

Figure 2B:
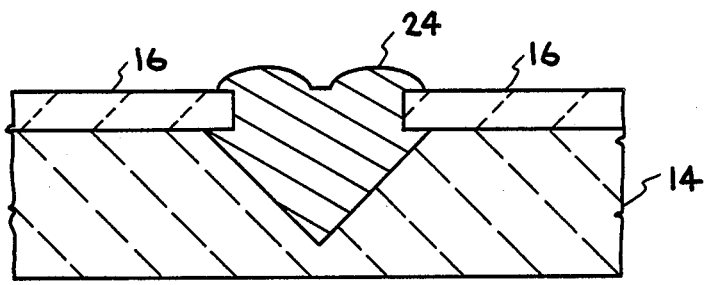

FIG. 2B shows the pit 20 filled with tungsten which has been deposited by low pressure chemical vapor deposition LPCVD. Tungsten deposited in this manner follows the contours of the pit very closely to form a tungsten tip 24 having a pyramidal shape. The tungsten fills the undercut regions 22 beneath the margins of the nitride layer 16. The tungsten also overlaps the margins of the top surface of the nitride layer 16. This filling of the undercut regions 22 and the marginal overlapping on top of the nitride layer 16 forms a strong mechanical bond to lock the tip 24 into the nitride layer 16.

Figure 2C:
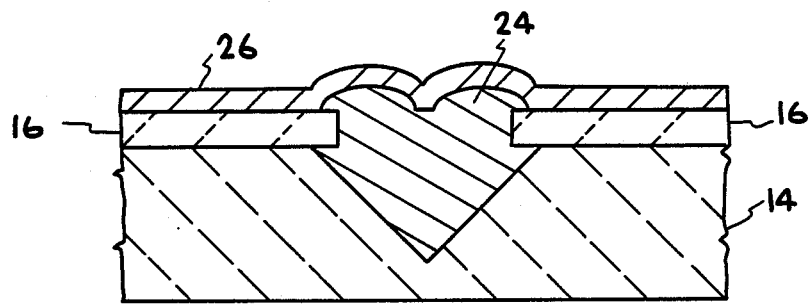

FIG. 2C shows a conductive layer 26 which is patterned and formed, for example, by sputtering techniques on the top side of the tip and the thin membrane 14, where the nitride layer 16 on the membrane is patterned and etched to form a cantilever arm.

Figure 2D:
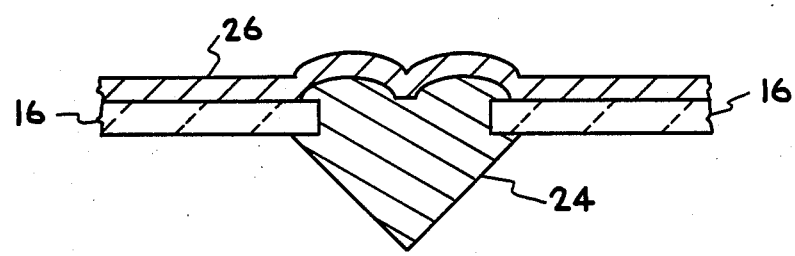

FIG. 2D shows a portion of a cantilever arm with a tungsten microminiature tip embedded therein. The silicon in the membrane 14 has been etched away with a suitable etchant such as KOH or EDP to expose the pyramidal-shaped tungsten tip 24.

Figure 4:
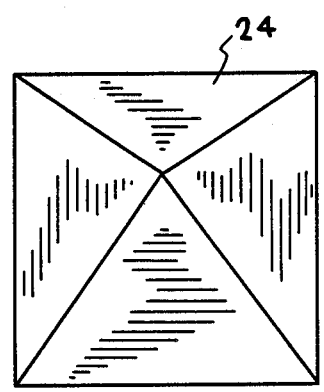
FIG. 4 is a closeup oblique view of a microminiature pyramidal tip similar to that shown in cross section in FIG. 2D.

FIG. 4 is an enlarged oblique view of the tungsten microminiature tip 24 shown in FIG. 2D. This view was taken from a scanning electron microscope SEM scan of a tip fabricated by using a pit etched in a silicon substrate. Each side of the symmetrical base of the tip is approximately 10 microns in length. The tip terminates in a sharp, symmetrical point, estimated to be less than 1000 angstroms.

Figure 5:
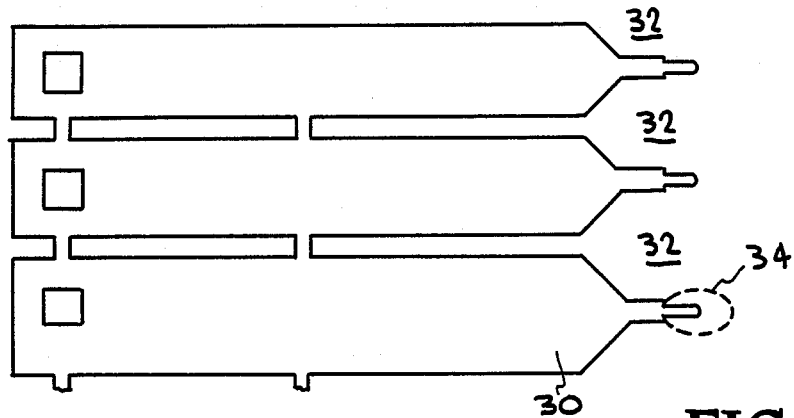
FIG. 5 is a plan view of a portion of a semiconductor substrate showing the outlines of several in-process cantilever arm assemblies having second embodiments of microminiature tips formed therein according to the invention.

FIG. 5 is a plan view of a portion of a silicon wafer pictorially showing a patterned silicon nitride pattern 30 which overlies the thermally grown silicon dioxide layer 32.

The silicon nitride pattern 30 is for three in process cantilever arm assemblies which are batch fabricated on the silicon wafer along with a large number of other cantilever arm assemblies. FIGS. 6A through 6E show in cross-section the details of fabrication as the cantilever 34, which is shown within the dotted line of FIG. 5, is fabricated.

Figure 6A:
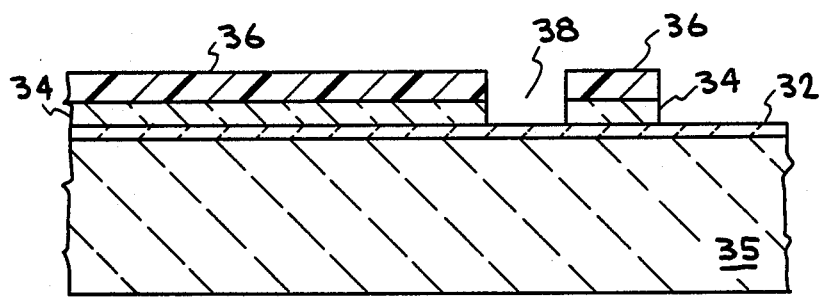
FIGS. 6A through 6E show magnified cross-sectional views for intermediate fabrication stages of a portion of the cantilever arm shown within the dotted line of FIG. 5.

FIG. 6A shows a (100) silicon substrate 35 on which is thermally grown the silicon dioxide layer 32 having a thickness of approximately 1000 angstroms. A 5000 angstrom silicon nitride layer is sputtered over the silicon dioxide layer 32. The nitride layer is patterned by means of a photoresist layer 36 to form the patterned nitride layer 34. An opening 38 is dry etched through the nitride down to the silicon dioxide layer 32.

Figure 6B:
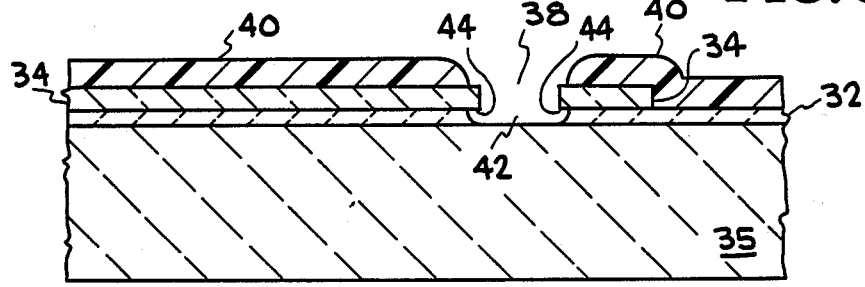

FIG. 6B shows a second patterned photoresist layer 40 which replaces the first photoresist layer 36 and which exposes the previously formed opening 38 in the nitride layer 34. The silicon dioxide beneath the opening 38 is etched away to provide an opening 42 in the silicon-dioxide layer 32. Note that the silicon dioxide layer 32 has undercut regions 44 formed beneath the nitride layer 34.

Figure 6C:
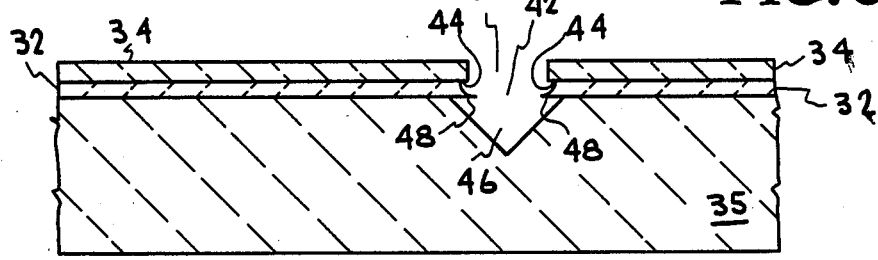

FIG. 6C shows that the photoresist layer 40 is next removed and that the (100) silicon substrate 35 is etched with KOH or EDP to form a pyramidal pit 46 with the pit having undercut regions 48 beneath the edge of the opening 42 in the silicon dioxide layer 48. The selective etching characteristic of the (100) silicon causes the faces of the pyramid to be in the (111) plane of the silicon wafer and the pit 46 to terminate at its bottom in a very sharp point.

Figure 6D:
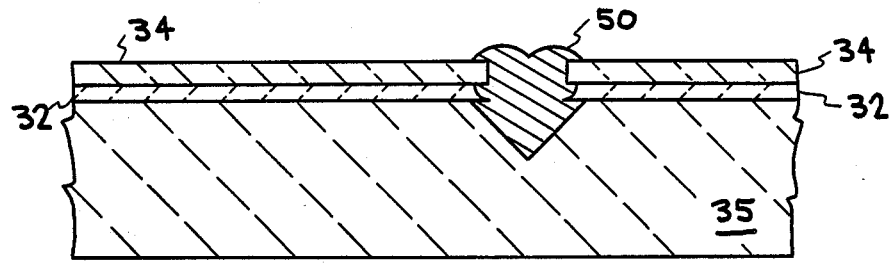

FIG. 6D shows the pit 46 and the openings 42,48 filled with tungsten which has been deposited by low pressure chemical vapor deposition LPCVD. Tungsten deposited in this manner will adhere only to the exposed silicon material, while it will not adhere to, for example, the thermal oxide layer 32. Tungsten deposited in this manner follows the contours of the silicon walls of the pit 46 very closely to form a tungsten tip 50 having a pyramidal shape. The tungsten also fills the undercut regions 44,48 and overlaps the margins of the top surface of the nitride layer 16. This filling of the undercut regions and the marginal overlapping on top of the nitride layer 16 forms a strong mechanical bond to lock the tip 50 into the silicon dioxide layer 32 and the nitride layer 34.

While the cantilever arm assemblies are still attached to the silicon wafer, additional fabrication steps are optionally performed. For example, additional piezo layers and conductive layers are formed to provide piezoelectric transducers such as disclosed in the patent application by Zdeblick et al. entitled "INTEGRATED SCANNING TUNNELING MICROSCOPE" Ser. No. 149,236, filed Jan/ 27, 1988. After fabrication the individual assemblies are separated for testing and further processing.

Figure 6E:
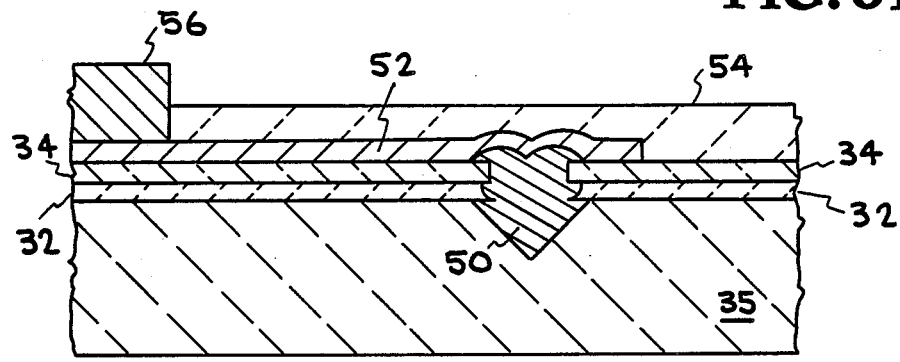

FIG. 6E shows a 10,000 angstrom conductive layer 52 of gold formed over a 100 angstrom layer of chrome. The conductive layer 52 is formed using a photoresist pattern and liftoff process over the silicon nitride layer 34 and is in contact with the base of the tip 50. The tip remains imbedded in the silicon substrate 35. Another silicon dioxide masking layer 54 is patterned over the top of the cantilever arm as a resist for electroplating of a low-stress nickel layer 56, which is greater than 1 mil thick.

Figure 7:
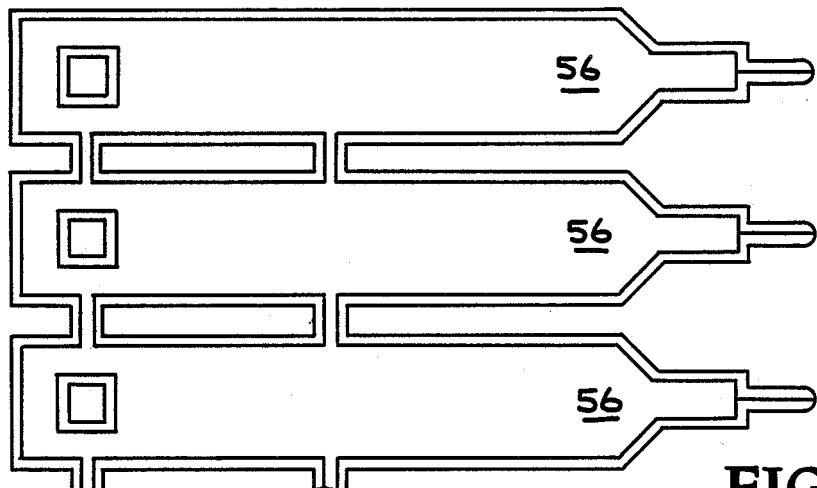
FIG. 7 is a plan view of a portion of the semiconductor substrate of FIG. 5 showing the outlines of several finished cantilever arm assemblies having second embodiments of the microminiature tips formed therein according to the invention.

FIG. 7 is a plan view showing the outlined of several cantilever arm assemblies with most of the assemblies being covered with a framework formed from the nickel layer 56.

Figure 8:
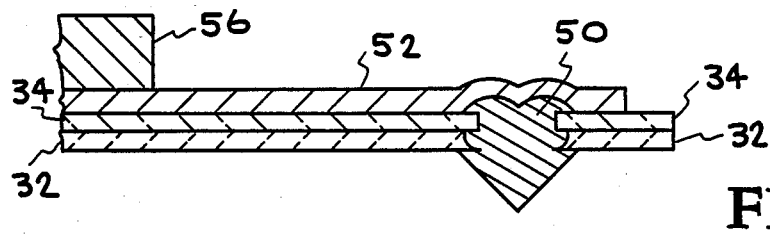
FIG. 8 shows a magnified cross-sectional view for a portion of the cantilever arm shown within the dotted line of FIG. 7.

FIG. 8 is a sectional view of one of the cantilever arm assemblies which has been freed from the underlying silicon substrate 35 by having the silicon substrate 35 and the silicon dioxide layer 54 etched away by a long etching with KOH. After etching, the individual assemblies can be snapped apart. Several hundred of these assemblies can be fabricated on a silicon wafer in a batch process.

The methods described hereinabove for fabricating microminiature tips permits the tip to be fabricated first with the additional items such as the cantilever, electrodes, and circuits to be fabricated subsequently. The tips are mechanically "riveted" securely to the cantilever with the electrodes sputtered or evaporated directly to the base of the tip to ensure physical and electronic connection between the tip and the cantilever and the electrodes. Tungsten has high strength and good conductivity. Tips can be further sharpened or resharpened by electrochemical etching of the tips in KOH or by ion milling. Other metals such as molybdenum, platinum, or irridium may be used to produce tips.

Tips produced by this process are sharp four-sided pyramids or short knife-edges SEM photographs were taken but were limited in resolution. Tips that have been fabricated appear to have a point radius of less than 1000 photographs of their profiles. The pyramid-shaped tips produced successfully to date range in size from 10 to 20 microns on a side. Yields were better than 75%.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in this art to best utilize the invention and various embodiments with various modifications as are suited to the particular use contemplated. It is intended that the scope of the invention be defined by the claims appended hereto and their equivalents.

I claim:

1. A method of forming a microminiature tip, comprising the steps of:
   coating a (100) silicon substrate with a layer of dielectric material;
   forming an aperture in said layer of dielectric material to expose a predetermined portion of the surface of said silicon substrate;
   anisotropically etching a pit in the predetermined portion of the surface of the (100) silicon substrate;
   depositing a tip material by chemical vapor deposition into said anisotropically etched pit to form a tip body using said anisotropically etched pit as a mold, said tip body being defined to extend from bas s and tapering inwardly to a predetermined extent, said tip body having a polygonal cross section at any point along its length;
   depositing said tip material into the aperture in said layer of dielectric material to form a base portion of said tip, which base portion is formed to engage said aperture and integrally attach the tip to said layer of dielectric material;
   removing the silicon substrate surrounding said deposited tip to provide a microminiature tip.

2. The method of claim 1 including the step of depositing said tip material into the aperture in said layer of dielectric material to form a base portion of said tip, which base portion is formed to engage said aperture and integrally attach the tip to said layer of dielectric material.

3. The method of claim 2 including:
   undercutting said dielectric material adjacent to said pyramidal pit to leave a lip of dielectric material around the edge of the pit; and
   selectively filling said pyramidal pit said tip material such that said tip material follows the contours of said pit and also forms underneath and over the lip of dielectric material to form a tip mechanically bonded to said layer of dielectric material.

4. The method of claim 3 wherein the step of depositing a tip material into said anisotropically etched pit to form a tip body using said anisotropically etched pit as a mold and the step of depositing said tip material into the aperture in said layer of dielectric material to form the base portion of said tip include selectively depositing said tip material by low-pressure chemical vapor deposition.

5. The method of claim 1 including forming an aperture in said layer of dielectric material which aperture is appropriate to result in a rectangular etched pit in the silicon substrate, anisotropically etching a rectangular pit in the silicon substrate, and depositing said tip material to form a tip body which has a rectangular cross section at any point along its length and which terminates in a line.

6. The method of claim 1 including forming an aperture in said layer of dielectric material which aperture is appropriate to result in a square etched pit in the silicon substrate, anisotropically etching a substantially square pit in the silicon substrate, and depositing said tip material to form a pyramidal-shaped tip body which has a substantially square cross section along its length and which terminates in a point.

7. The method of claim 1 wherein the step of anisotropically etching a pit in the predetermined portion of the surface of the (100) silicon substrate includes etching with a KOH solution.

8. The method of claim 1 wherein the step of anisotropically etching a pit in the predetermined portion of the surface of the (100) silicon substrate includes etching with EDP.

9. The method of claim 1 wherein said tip material includes an electrically conductive material.

10. The method of claim 8 wherein the tip material includes tungsten.

11. The method of claim 1 wherein the method of forming a microminiature tip includes batch forming a plurality of microminiature tips spaced apart on a single silicon substrate.

12. A method of fabricating a microminiature tip assembly, comprising the steps of:
   providing a (100) oriented silicon substrate;
   forming a masking layer of dielectric material on the top surface of said silicon wafer;
   forming an opening in said dielectric masking layer to expose a selected portion of the top surface of said silicon wafer;
   anisotropically etching the selected portion of the top surface of said (100) oriented silicon wafer to form a pyramidal pit in said silicon surface;
   undercutting said dielectric material adjacent to said pyramidal pit to leave a lip of dielectric material around the edge of the pit;
   selectively filling said pyramidal pit with LPCVD tungsten such that said tungsten follows the contours of said pyramidal pit and also forms underneath and over the lip of dielectric material to form a conductive tip mechanically bonded to said layer of dielectric material;
   depositing a conducting layer over said conductive tip and said layer of dielectric material;
   patterning said layer of dielectric material into a cantilever structure;
   removing said silicon substrate to provide a cantilever of said dielectric material with said conductive tip attached thereto.

13. A microminiature tip assembly, comprising:
a support arm member having an aperture formed therein;

a microminiature tip member having a base portion engaged by said support arm member within said aperture, said microminiature tip also having a body portion extending from said base portion and tapering inward to a predetermined extent, said body portion having a polygon cross section at any point along its length.

14. The tip assembly of claim 13 wherein said polygonal cross-section is substantially rectangular and wherein said body portion terminates in a line.

15. The tip assembly of claim 13 wherein said polygon is substantially square and wherein said body portion is pyramidal in shape and terminates in a point.

16. The tip assembly of claim 13 wherein said tip member is electrically conductive.

17. The tip assembly of claim 16 including a conductor formed on said support arm member and electrically coupled to said tip member.

18. The tip assembly of claim 13 wherein said support arm member is formed as a thin dielectric layer.

19. The tip assembly of claim 13 wherein said base portion of said tip member has a groove formed therein which groove is engaged by portions of said support arm member adjacent to said aperture in said support arm member to mechanically lock said tip assembly to said support arm member.

20. A microminiature tip for atomic force microscopy, scanning tunneling microscopy, field emission microscopy, and microfilming, comprising a microminiature tip member having a base from which a body portion extends and tapers inwardly to a predetermined extent, said body portion having a polygonal cross-section at any point along its length.

21. The tip of claim 20 wherein said polygonal cross-section is substantially rectangular and wherein said body portion terminates in a line.

22. The tip of claim 20 wherein said polygonal cross-section is substantially square and wherein said body portion terminates in a point.

23. The tip of claim 20 wherein said tip member is formed of a conductive material.

24. The tip of claim 23 wherein said conductive material includes tungsten.

25. The tip of claim 24 wherein said tungsten is deposited by chemical vapor deposition.

26. The tip of claim 24 wherein said conductive material includes nickel.

* * * * *